United States Patent [19]

Higaki

[11] Patent Number: 5,217,834
[45] Date of Patent: Jun. 8, 1993

[54] METHODS OF FORMING AND INSPECTING SEMICONDUCTOR DEVICE PATTERNS

[75] Inventor: Tomotaka Higaki, Yokohama, Japan

[73] Assignee: Kabushiki Kaisha Toshiba, Kawasaki, Japan

[21] Appl. No.: 744,517

[22] Filed: Aug. 13, 1991

[30] Foreign Application Priority Data

Aug. 14, 1990 [JP] Japan .................................. 2-214603

[51] Int. Cl.⁵ .............................................. G03F 7/20
[52] U.S. Cl. .................................... 430/30; 430/311; 250/492.2
[58] Field of Search ...................... 430/30, 296, 311; 250/492.2; 356/373, 376

[56] References Cited

U.S. PATENT DOCUMENTS

| | | | |
|---|---|---|---|
| 3,998,639 | 12/1976 | Feldman | 430/30 |
| 4,864,356 | 9/1989 | Asano | 430/30 |
| 5,044,750 | 9/1991 | Shamble | 430/30 |

FOREIGN PATENT DOCUMENTS 359497  3/1990  European Pat. Off. .............. 430/30

Primary Examiner—Marion E. McCamish
Assistant Examiner—Kathleen Duda
Attorney, Agent, or Firm—Finnegan, Henderson, Farabow, Garrett & Dunner

[57] ABSTRACT

Method of forming a pattern on a semiconductor wafer, the temperature of the semiconductor wafer being detected by a thermocouple. When the detected temperature is at a specified value which indicates that the deformation of the semiconductor wafer is within an allowable range, a step of forming a pattern on the semiconductor wafer is performed. This forming method improves the accuracy in forming the pattern. Also, in a method of inspecting a pattern on a semiconductor wafer, the temperature of the semiconductor wafer is detected using a thermocouple. When the detected temperature is at a specified value which indicates that the deformation of the semiconductor wafer is within an allowable range, a step of inspecting a pattern on the semiconductor wafer is performed. This inspecting method improves the accuracy in inspecting the pattern.

8 Claims, 1 Drawing Sheet

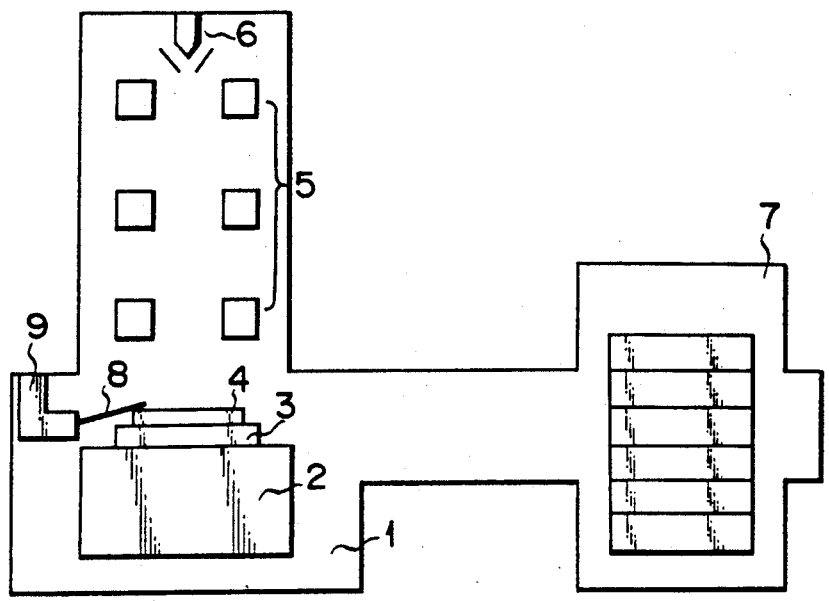
F I G. 1
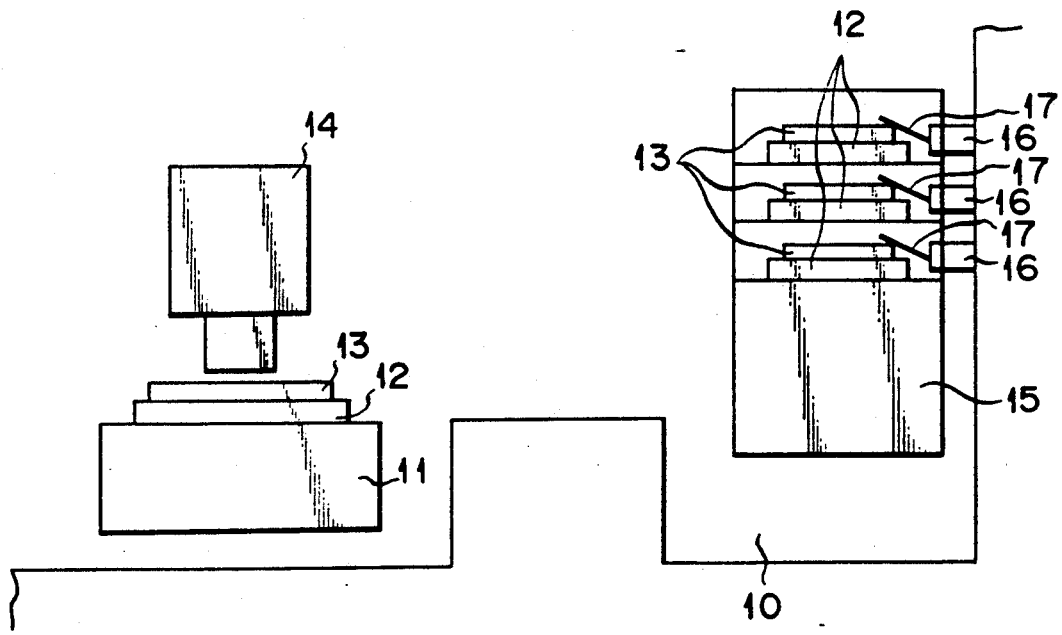
F I G. 2

METHODS OF FORMING AND INSPECTING SEMICONDUCTOR DEVICE PATTERNS

BACKGROUND OF THE INVENTION

1. Field of the Invention

The present invention relates to methods for forming and inspecting the patterns for semiconductor devices using the optical- or electron-beam lithography technique.

2. Description of the Related Art

The optical- or electron-beam lithography technique is used for the patterning process in manufacturing semiconductor devices, and the pattern forming accuracy and pattern inspecting accuracy become important as the integration increases. Glass masks or semiconductor substrates are frequently deformed by a change in temperature. This deformation affects the pattern forming accuracy and pattern inspecting accuracy. To prevent the influence, the system is adopted to control the temperature of the glass masks or semiconductor substrates by leaving them in a constant-temperature equipment before applying the optical- or electron-beam lithography to them.

Semiconductor wafers or glass masks with semiconductor device patterns are conventionally prevented from deformation by leaving them in a constant-temperature equipment and keeping them at the specified temperature in order to improve the pattern forming accuracy and pattern inspecting accuracy. However, the temperature or temperature distribution of semiconductor wafers or glass masks often vary before they are placed in the constant-temperature equipment. Likewise the heat transfer characteristic also varies between individual semiconductor wafers or glass masks. As such, it is conventionally difficult to detect the temperature of each of them and the temperature distribution at the time they are left in the constant-temperature equipment. When patterns are formed or inspected before deformation due to temperature change is not adequately eliminated, the pattern forming accuracy and pattern inspecting accuracy are degraded. In addition, to adequately remove the deformation, the time for leaving semiconductor wafers or glass masks extremely increases time required for production and thereby, the production throughput decreases.

SUMMARY OF THE INVENTION

The present invention is made under the above situation and it is an object of this invention to provide methods for forming and inspecting semiconductor device patterns allowing high-accuracy pattern forming and inspection.

The methods for forming and inspecting semiconductor device patterns related to the present invention are characterized in that the temperature or temperature distribution of semiconductor substrates or glass masks is measured to detect that they reach a certain temperature or temperature distribution before applying the exposure or pattern-inspection process to them.

According to the present invention, there is provided a method of forming a pattern for a semiconductor element, comprising the steps of measuring the temperature of a semiconductor wafer, and exposing the wafer to a beam in order to form a pattern on the wafer when the temperature is at the specified value.

According to the present invention, there is provided a method of forming a pattern for a semiconductor element, comprising the steps of measuring the temperature distribution on a semiconductor wafer, and exposing the wafer to a beam in order to form a pattern on the wafer when the temperature distribution is at the specified value.

According to the present invention, there is provided a method of forming a pattern for a semiconductor element, comprising the steps of measuring the temperature of a glass mask, and exposing the glass mask to a beam in order to form a pattern on the glass mask when the temperature is at the specified value.

According to the present invention, there is provided a method of forming a pattern for a semiconductor element, comprising the steps of measuring the temperature distribution on a glass mask, and exposing the glass mask to a beam in order to form a pattern on the glass mask when said temperature distribution is at the specified value.

According to the present invention, there is provided a method of inspecting a pattern for a semiconductor element, comprising the steps of measuring the temperature of a semiconductor wafer having a pattern thereon, and inspecting the pattern on the wafer when the temperature is at the specified value.

According to the present invention, there is provided a method of inspecting a pattern for a semiconductor element, comprising the steps of measuring the temperature distribution on a semiconductor wafer having a pattern thereon, and inspecting the pattern on the wafer when the temperature distribution is at the specified value.

According to the present invention, there is provided a method of inspecting a pattern for a semiconductor element, comprising the steps of measuring the temperature of a glass mask having a pattern thereon, and inspecting the pattern on the glass mask when the temperature is at the specified value.

According to the present invention, there is provided a method of inspecting a pattern for a semiconductor element, comprising the steps of measuring the temperature distribution on a glass mask having a pattern thereon, and inspecting the pattern on the glass mask when the temperature distribution is at the specified value.

It is said that the development of semiconductor devices is two generations ahead of mass production of them. Table 1 shows the time for starting the development of semiconductor devices according to the estimated mass-production starting time of them shown in "NIKKEI Micro Device, 1989-8", in which the value five times as much as the semiconductor-device design rule is specified as the minimum dimension of the reticle. In Table 1, the pattern placement accuracy relates to the pattern displacement for 100 mm of design for a glass mask.

TABLE 1

| 89 | 90 | 91 | 92 | 93 | 94 | 95 | 96 | 97 | 98 | Year |
|----|----|----|----|----|----|----|----|----|----|------|
| \| | \| | \| | \| | \| | \| | \| | \| | \| | \| | Minimum dimension of reticle (μm) |

TABLE 1-continued

| 2.0 μm | - | 1.25 μm | - | - | 1.0 μm | - | - | 0.5 μm | - | - | |
| ±1.0 μm | - | ±0.0625 μm | - | - | 0.05 μm | - | - | ±0.025 μm | - | - | Pattern placement (μm) accuracy of reticle |
| | | | | | 0.2 μm | - | - | 0.1 μm | - | - | Minimum dimension of X-ray mask |
| | | | | | ±0.01 μm | - | - | ±0.005 μm | - | - | Pattern placement accuracy of X-ray mask |

16MDRAM ←— 64MDRAM —→ ←— 256KDRAM —→ ←— 1GDRAM —→ ←— 4GDRAM   Developed device

Referring to Table 1, when optical lithography cannot be used, a reticle should be changed to an X-ray mask. The X-ray mask has the size equal to the design rule of the semiconductor device. To the contrary, in optical lithography, the reticle is required to have the size five times as large as the semiconductor-device design rule.

Table 2 shows the coefficient of linear expansion of several materials.

TABLE 2

| | Quartz glass | Silicon | Titanium |
|---|---|---|---|
| Linear expansion coefficient (μm/100 mm°C.) | 0.05 | 0.24 | 0.085 |

The unit "μm/100 mm° C." represents the increase of pattern displacement for 100 mm when the temperature rises by 1° C.

Table 3 shows the allowable temperature difference of several materials for pattern placement accuracy.

TABLE 3

| Pattern placement accuracy | Allowable temperature difference | | |
|---|---|---|---|
| | Quartz galss | Silicon | Titanium |
| ±0.1 μm | 2° C. | 0.42° C. | 1.17° C. |
| ±0.0625 μm | 1.25° C. | 0.26° C. | 0.72° C. |
| ±0.05 μm | 1° C. | 0.21° C. | 0.59° C. |
| ±0.01 μm | 0.2° C. | 0.04° C. | 0.12° C. |
| ±0.005 μm | 0.1° C. | 0.02° C. | 0.06° C. |

From the above thermal characteristics of materials in the exposure or inspection process, we learn that, when it is assumed that an X-ray glass mask having a rule equal to the design rule is used in the generation after 256 MD-RAM, as identified in Table 1, local temperature difference of an X-ray mask may become a problem. This is because the pattern is formed on the semiconductor wafer at the rule of the X-ray glass mask and the allowable temperature difference is small.

Moreover, pattern placement accuracy is not necessarily proportional only to the linear expansion coefficient of the material used. For example, assume that a glass mask is held in a titanium cassette by a metallic clamp. In this case, it is considered that the distribution of stress applied to the glass mask changes when each material expands and, thereby, an influence greater than that of linear expansion coefficient appears.

Furthermore, use of the method to prevent the influence on the pattern placement accuracy by a constant-temperature equipment causes a problem to occur in throughput. The reason for this is that, though the glass mask temperature levels off after leaving the glass mask in a constant-temperature equipment for a certain time, the temperature of the glass mask before placing it in the equipment and the thermal conductivity of the cassette and glass mask vary, and thus, the duration until they are thermally balanced differs respectively. That is, a problem lies in the fact that each component has its own optimum duration for thermal balancing.

In addition to the above, another problem lies in the time the thermal variation occurs. When a glass mask is left in a constant-temperature equipment, a problem occurs if thermal variation occurs. This is because a temperature monitoring means is not directly installed on the glass mask but on a peripheral unit, and thus, the temperature of the glass mask can not be directly detected by the monitoring means. It is clarified that it is incomplete to control the glass mask temperature at 0.1° C. order by making the ambient temperature constant.

The present invention is completed from this point of view in order to improve the pattern forming accuracy and pattern inspecting accuracy due to thermal deformation of a semiconductor substrate or glass mask by installing a temperature detector capable of directly measuring the temperature of the semiconductor substrate or glass mask to control the temperature or temperature distribution at 1/100 order. That is, the temperature of the semiconductor substrate or glass mask is measured by contacting temperature measuring means directly with the semiconductor substrate or glass mask, respectively. Thus, the substantially same advantage can be obtained for batch processing because the deformation of each object is eliminated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows a patterning apparatus to which a pattern forming method of an embodiment of the present invention is applied; and FIG. 2 shows a pattern inspection apparatus to which a pattern inspection method of an embodiment of the present invention is applied.

DETAILED DESCRIPTION OF THE PREFERRED EMBODIMENTS

The following is the description of embodiments of the present invention according to FIGS. 1 and 2.

FIG. 1 shows a patterning apparatus using electron beams. The description is hereafter made for the case in which the method for forming semiconductor device patterns according to the present invention is applied to the patterning apparatus.

A sample chamber 1 is maintained at the atmospheric pressure of $10^{-6}$ Torr and a stage 2 is installed in the sample chamber 1. A sample holder 3 is mounted on the stage 2 and a sample 4 is placed on the holder 3. The sample is a semiconductor wafer or glass mask. This embodiment uses a semiconductor wafer as the sample. An electron-beam gun 6 is installed at the top, facing a semiconductor wafer 4. Lenses for deflection and convergence are installed at the both sides of the electron beam course.

A stocker 7 for stocking the semiconductor wafer 4 is installed also in the sample chamber 1. Semiconductor wafers 4 are respectively set on sample holders 3, one each, in the stocker 7.

Before the specified patterns are drawn on the semiconductor wafer 4 by the patterning apparatus, it is checked whether or not the semiconductor wafer 4 placed on the stage 2 is at the specified temperature.

The temperature of semiconductor wafer 4 is measured by contacting temperature measuring means directly with the semiconductor wafer 4, as described below. The temperature is measured by a thermocouple 8 and a voltmeter. That is, one end of the thermocouple 8 is contacted with the semiconductor wafer 4 by operating a robot arm 9. The other end of the thermocouple 8 is connected to a reference voltage terminal (not illustrated). The voltmeter is connected between the terminals of thermocouple 8 to detect a potential difference between the terminals of the thermocouple 8. The potential difference corresponds to the temperature difference between the terminals of the thermocouple 8. Thus, the temperature of the semiconductor wafer 4 can be determined from the potential difference between one and the other ends of the thermocouple 8 with the voltmeter. The principle of temperature detection by a thermocouple is already known but it is not the main point of the present invention. Therefore, the description of the temperature detection by the thermocouple 8 is assumed to be known by one of ordinary skill.

If the obtained temperature indicates the specified value, it represents that deformation of the semiconductor wafer 4 is within the allowable value. When the obtained temperature is at the specified value, the electron beam gun 6 is operated under a control signal to generate electron beams toward the semiconductor wafer.

The calculation of the temperature and the control of the electron gun 6 may be performed under the control of a computer (not shown).

The direction and beam size of the electron beam are controlled by the deflection and convergence lens system 5. Photoresist (not shown) applied on the semiconductor wafer 4 is sensitized by the electron beam, the exposed portion becomes insoluble, and patterns are formed. Photoresist which becomes soluble when it is sensitized can also be used.

For the above embodiment, the temperature at one point on the semiconductor wafer 4 is detected. However, the temperature distribution on the semiconductor wafer 4 may also be detected. The temperature distribution of the semiconductor wafer 4 may also be measured by contacting temperature measuring means directly with the semiconductor wafer 4, as will be described. The temperature distribution can be obtained by moving the thermocouple to the specified measuring points with the robot 9 and measuring the temperature at each point.

More accurate patterns can be obtained by detecting the temperature distribution rather than by detecting the temperature only at one point.

In the present invention, the semiconductor wafer 4 is defined as a semiconductor substrate on which one or more types of circuit components including an active device, passive device, and resistance are formed.

Not only a semiconductor wafer but also a glass mask used to form patterns on a semiconductor wafer can be used as the sample 4. Preferably, and by example only, the size of glass mask is 127 mm square in general. However, some glass masks may have the size of 160 mm square. The glass mask 4 is preferably made of synthesized quartz, soda lime, or lithium.

As previously mentioned, the sample 4 is affected by the heat of the sample holder 3 and stage 2. Therefore, even more accurate patterns can be formed by detecting not only the temperature of the sample 4, but also that of the sample holder 3 and/or the stage 2 and executing the patterning process when each of them reaches the specified temperature. The temperature of these objects can be detected by moving the robot arm, 9 to make a thermocouple 8 successively contact with the sample holder 3 and stage 2, and measuring a potential difference between a reference potential and a potential of each of the sampled holder 3 and stage 2. Instead of moving the single robot arm 9 successively, a robot arm may be provided for each of the objects, and may be moved to contact the corresponding object.

The above embodiment describes the case in which the method of the present invention is applied to a patterning apparatus. However, it is also possible to apply the method to a stepper and repeater projector.

FIG. 2 shows a pattern-position-displacement inspecting system for a semiconductor wafer. The following is the description of the case in which the inspecting method of the present invention is applied to the inspecting system.

In FIG. 2, a stage 11 is installed in a sample chamber 10. A sample holder 12 is mounted on the stage 11 and a glass mask 13 is placed on the holder 12. A position-displacement inspection device 14 facing the glass mask 13 is installed above the glass mask 13, which detects the displacement of the patterns formed on the glass mask 13.

A stocker 15 is installed in the sample chamber 10 and a plurality of glass masks 13 are respectively placed on the sample holders 12, one each, in the stocker 15.

For the above configuration, a thermocouple 17 is operated by a robot arm 16 in the stocker 15 to make the thermocouple 17 contact the respectively-corresponding glass mask 13 and, thereby, the temperature of the glass mask 13 is detected through the thermocouple.

If the detected temperature indicates the specified value, it represents that deformation of the glass mask 13 is within the allowable value. Thus, when detected temperature is at a specified value, the glass mask 13 is sent to the stage 11 together with the sample holder 12 by a carrying system (not shown). The position-displacement of the pattern of the glass mask 13 placed on the stage 11 is detected by a known pattern-position-displacement inspection device 14 installed above the stage 11.

The calculation of the temperature, the transfer of the sample 4 and the control of the inspection device 14 may be performed under the control of a computer (not shown).

Not only the temperature of the sample 13 but also that of the sample holder 12 may be detected. When the both objects are within the specified temperature range, they are sent to the stage 11, and more accurate pattern inspection can be executed.

It is also possible to detect the temperature distribution on the glass mask instead of detecting the temperature at one point on it. In this case, the displacement can more accurately be detected.

It is also possible to detect the displacement of patterns on a semiconductor wafer instead of detecting the displacement of patterns on a glass mask.

In addition, displacement can more accurately be detected by detecting the temperature of the glass mask 13 and/or the sample holder 12 not only on the stocker 15 but also on the inspecting section. In this case, it is only necessary to install a temperature-detecting thermocouple (not shown) and a robot arm (not shown) for operating it on the detecting section.

For the above embodiment, the throughput is improved because the samples selected by the stocker 15 are successively sent to the inspecting section.

As clarified from the above mentioned, the present invention improves the pattern forming accuracy and pattern inspecting accuracy because the patterns are formed and inspected when the thermal deformation of the samples is at the specified range, and also improves the throughput because the sample being within the specified temperature range are selectively sent to the pattern-inspecting or pattern-forming section.

Furthermore, when the temperature monitoring is performed even during the pattern forming step or the pattern inspecting step, the accuracy of the pattern formation or the pattern inspection can be more improve.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming a pattern for a semiconductor element, comprising the steps of:

measuring the temperature of a semiconductor wafer by contacting temperature measuring means directly with said wafer; and exposing said wafer to a beam in order to form the pattern on said wafer when said temperature is at a specified value.

2. A method of forming a pattern for a semiconductor element, comprising the steps of:

measuring the temperature distribution on a semiconductor wafer by contacting temperature measuring means directly with said wafer; and exposing said wafer to a beam in order to form the pattern on said wafer when said temperature distribution is at a specified value.

3. A method of forming a pattern for a semiconductor element, comprising the steps of:

measuring the temperature of a glass mask by contacting temperature measuring means directly with said glass mask; and exposing said glass mask to a beam in order to form the pattern on said glass mask when said temperature is at a specified value.

4. A method of forming a pattern for a semiconductor element, comprising the steps of:

measuring the temperature distribution on a glass mask by contacting temperature measuring means directly with said glass mask; and exposing said glass mask to a beam in order to form the pattern on said glass mask when said temperature distribution is at a specified value.

5. A method of inspecting a pattern for a semiconductor element, comprising the steps of:

measuring the temperature of a semiconductor wafer having the pattern thereon by contacting temperature measuring means directly with said wafer; and inspecting the pattern on said wafer when said temperature is at a specified value.

6. A method of inspecting a pattern for a semiconductor element, comprising the steps of:

measuring the temperature distribution on a semiconductor wafer having the pattern thereon by contacting temperature measuring means directly with the said wafer; and inspecting the pattern on said wafer when said temperature distribution is at a specified value.

7. A method of inspecting a pattern for a semiconductor element, comprising the steps of:

measuring the temperature of a glass mask having the pattern thereon by contracting temperature measuring means directly with said glass mask; and inspecting the pattern on said glass mask when said temperature is at a specified value.

8. A method of inspecting a pattern for a semiconductor element, comprising the steps of:

measuring the temperature distribution on a glass mask having the pattern thereon by contacting temperature measuring means directly with said glass mask; and inspecting the pattern on said glass mask when said temperature distribution is at a specified value.

* * * * *